United States Patent [19]
Henning

[11] 3,808,058

[45] Apr. 30, 1974

[54] FABRICATION OF MESA DIODE WITH CHANNEL GUARD

[75] Inventor: Stephen Michael Henning, Fleetwood, Pa.

[73] Assignee: Bell Telephone Laboratories, Incorporated, Murray Hill, N.J.

[22] Filed: Aug. 17, 1972

[21] Appl. No.: 281,295

[52] U.S. Cl. .................... 148/1.5, 29/583, 148/187, 156/17, 317/235

[51] Int. Cl. .................... H01l 7/54

[58] Field of Search...148/1.5 C–1.5 P; 317/235; 156/17; 29/583

[56] References Cited

UNITED STATES PATENTS

| | | | |
|---|---|---|---|
| 3,607,449 | 9/1969 | Tokuyama et al. | 148/1.5 |
| 3,675,313 | 7/1972 | Driver et al. | 148/187 X |
| 3,639,975 | 2/1972 | Tefft et al. | 156/17 X |
| 3,484,313 | 12/1969 | Tauchi et al. | 148/187 |
| 3,728,179 | 4/1973 | Davidson et al. | 156/17 X |
| 3,730,778 | 5/1973 | Shannon et al. | 148/1.5 |

*Primary Examiner*—L. Dewayne Rutledge
*Assistant Examiner*—J. M. Davis
*Attorney, Agent, or Firm*—H. W. Lockhart

[57] ABSTRACT

A semiconductor diode of the mesa type having a channel guard zone is made by using a silicon nitride etch mask for the mesa etching step. As a result of the mesa etching, the silicon nitride mask is undercut leaving an overhang which then is utilized as a shadow mask for an ion implantation step. The ion implantation step produces a channel guard zone which, because of the mask overhang, is spaced away from the exposed edge of the diffused P-N junction in the mesa.

1 Claim, 7 Drawing Figures

ION-IMPLANT PHOSPHORUS
USING NITRIDE MASK

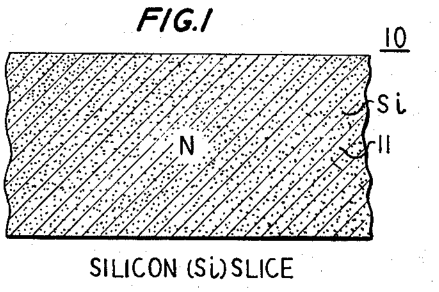
SILICON (Si) SLICE
FIG. 2
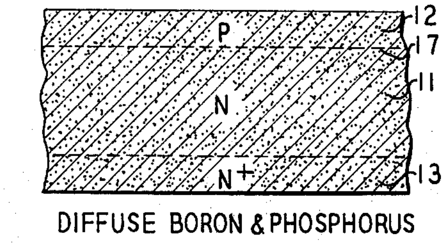
DIFFUSE BORON & PHOSPHORUS
FIG. 3
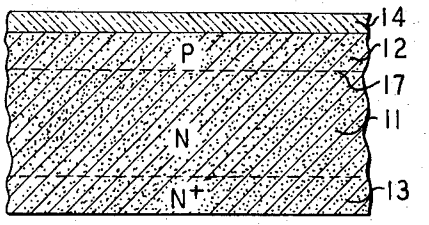
DEPOSIT SILICON NITRIDE
$(Si_3N_4)$ COATING
FIG. 4
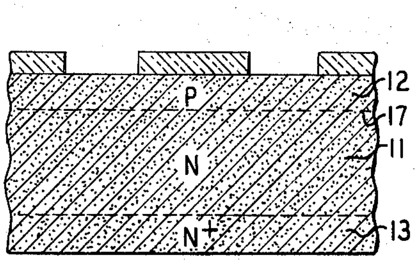
DEFINE PATTERN IN
NITRIDE COATING
FIG. 5
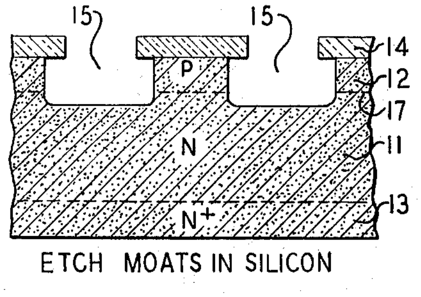
ETCH MOATS IN SILICON
FIG. 6
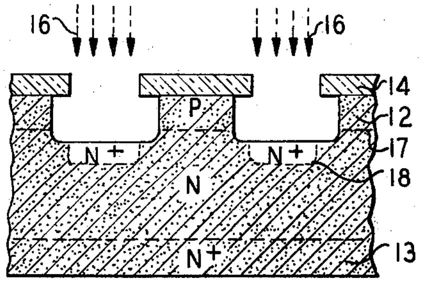
ION-IMPLANT PHOSPHORUS
USING NITRIDE MASK
FIG. 7
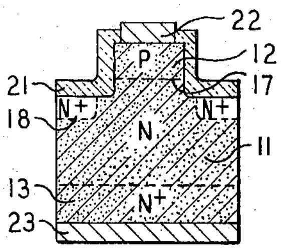
REMOVE NITRIDE, APPLY OXIDE-PASSIVATION COATING AND METAL
CONTACTS, SEPARATE SLICE INTO INDIVIDUAL DIODES

FABRICATION OF MESA DIODE WITH CHANNEL GUARD

This invention relates to the fabrication of a semiconductor diode of the mesa type having a channel guard zone. More particularly, it is related to a fabrication process utilizing selective etching and ion implantation to produce advantageously a semiconductor rectifier having suitably high voltage breakdown.

BACKGROUND OF THE INVENTION

High voltage semiconductor diodes of the P-N junction type require a relatively high level of breakdown in the reverse direction. Although devices of this type have been fabricated in the planar configuration, such structures are more susceptible to breakdown as a consequence of the sharp curvature of the junction characterized by the planar form. Also, the surface effects of planar junctions require extraordinary measures to prevent surface breakdown. Consequently, the mesa configuration has generally been found more advantageous from the standpoint of high voltage characteristics. However, although this configuration avoids the junction curvature problem, there are still surface breakdown problems which are most conveniently overcome by the provision of a channel guard zone of suitable conductivity type material. The presence of such a zone, precisely spaced away from the boundary of the active P-N junction, inhibits reverse breakdown without degrading other performance characteristics. It is important to fabricate such a channel guard zone conveniently without complicated fabrication steps. In accordance with this invention, the provision of such a channel guard zone is made a convenient part of the overall fabrication procedure of a mesa type diode.

SUMMARY OF THE INVENTION

In accordance with the invention, semiconductor diodes are fabricated in batch form in which a large number of diodes are produced from a single slice of silicon semiconductor material. The slice is subjected to solid state diffusion or equivalent treatment to produce a P-N junction through the entire slice parallel to the major faces of the slice. Then a mask of silicon nitride is formed on one major face of the slice in a pattern defining the top surface of the mesas of the individual diodes. Next, the mesas are formed by treating the masked surface of the slice with an etchant which attacks the exposed semiconductor material but does not substantially attack the silicon nitride mask. Inasmuch as the etching treatment is isotropic, that is, it proceeds at a substantially equal rate in all directions against the semiconductor material, moats are formed by removal of material downward into the slice and laterally beneath the silicon nitride mask as well. As a consequence of the etching step, there is an undercutting therefore of the mask and the consequent overhang of the silicon nitride layer is used to mask an ion implantation step which follows. Using ion bombardment treatment, conductivity type zones of relatively high conductivity and of like conductivity to the bulk portion of the diode are formed in a zone at the bottom of each moat. Because of the overhanging silicon nitride mask, the lateral extent of these ion implanted zones is precisely determined and the implanted zones are suitably spaced away from the exposed boundary of the active P-N junction located in each mesa. The slice then is cut apart approximately through the bottom of each moat to form a plurality of individual mesa diodes, each having a high conductivity channel guard zone adjoining the periphery of each diode and spaced away from the P-N junction edge.

Thus, the process in accordance with this invention advantageously provides a channel guard zone without significant addition of processing steps and without complex masking operations.

BRIEF DESCRIPTION OF THE DRAWING

The invention and its objects and features will be more clearly understood from the following description taken in conjunction with the drawing in which FIGS. 1 through 6 are cross sections of a portion of a semiconductor slice illustrating a sequence of fabrication steps in accordance with the invention, and FIG. 7 is a cross-sectional view of a completed semiconductor diode in accordance with the invention.

DETAILED DESCRIPTION

Referring to FIG. 1, there is shown a portion 10 of N-type conductivity single crystal silicon. The portion 11 represents a segment of a slice which may be from one to two or more inches in diameter and about 9 or 10 mils in thickness, conventionally utilized as the base material for fabricating semiconductor devices in batch form. The N-type portion 11 is subjected to solid state diffusion treatments, typically using boron and phosphorus as the significant impurities to produce a P-type zone 12 adjacent one face of the slice and a high conductivity N+ zone 13 adjacent the opposite face. Typically, the depth of these zones is about 1.3 mils in a slice having a total thickness originally of 9 mils. It will be appreciated that these P and N+ terminal zones may be formed by a variety of techniques well known in the art. They may be formed by sequential selective diffusion or by simultaneous diffusion using "paint-on" techniques as well as by ion implantation. The structure, as shown in FIG. 2, is a conventional configuration in the fabrication of P-N junction semiconductor diodes.

In FIG. 3, the slice is shown with a layer 14 of silicon nitride on the boron diffused, or junction face of the slice; that is, the face of the slice which is closest to the active P-N junction 17. The layer 14, of silicon nitride, is formed by any one of a number of deposition processes which are well known in the art. One convenient technique utilizes a reaction at high temperature using silicon tetrachloride and ammonia. The layer 14 conveniently has a thickness of about 2,500 angstroms.

Then, as shown in FIG. 4, the silicon nitride is treated, typically by plasma etching with a fluorine-containing plasma selectively, to produce the mask for etching the mesas of the diodes. A technique for selective etching of silicon nitride is to form, by conventional photoresist techniques, an etch-resistant mask which resists the plasma etch and enables selective etching of the silicon nitride.

The masked surface of the slice of FIG. 4 then is treated with an etchant such as a mixture of hydrofluoric, nitric and acetic acids in the ratio 5:3:3, by volume, to etch the moats 15 shown in the view of FIG. 5. This etchant does not substantially attack the silicon nitride mask 14. Typically, the moats 15 have a depth of about 3.5 mils, thus penetrating well below the level of the P-N junction 17. Inasmuch as the etchant is substantially isotropic, there is an undercutting of the silicon nitride mask 14. Such undercutting typically may produce an overhang of about 2 mils. As shown in FIG. 6, this overhang is taken advantage of in conjunction with an ion implantation treatment, represented by the arrows 16, to form shallow N+-type zones 18 adjacent the bottom of the moats. The significant feature of this processing step is that the lateral extent of these N-type zones 18 is precisely defined by the overhanging edge of the undercut silicon nitride mask 14 and the straight line path which is characteristic of the ion beam. Consequently, the boundaries of the N+ zones 18 are inherently spaced away from the boundary of the active P-N junction 17 in the mesa by the lateral dimension of the mask overhang.

The ion implantation step typically implants phosphorus at about 30 Kev to an impurity concentration level of at least $1\times10^{12}$ per square centimeter. Obviously, a semiconductor device of similar configuration, but having reversed conductivity types may be similarly fabricated utilizing suitable significant impurities by following the same procedural steps. Also, the etching mask can be formed of other materials than silicon nitride, such as aluminum oxide or a silicone resin.

Individual semiconductor diodes, as shown in FIG. 7, are fabricated by dividing the slice of FIG. 6 into individual mesa containing dies. Prior to such division, conventional treatment steps for the slice may comprise removal of all masking layers, followed by the formation of a silicon oxide film over the active surface of the slice, followed by a second layer of silicon nitride. Contact windows then are opened by selective etching to expose a portion of the top surface of each mesa. Contact metal then is applied to opposite exposed semiconductor faces of the slice and the slice then divided into individual dies. The final device, ready for mounting, is as shown in FIG. 7 in which 22 and 23 are the two metallic contact members forming the device terminals and 21 is the dual dielectric coating of silicon nitride and the silicon oxide.

Referring to the device of FIG. 7, the peripherally disposed implanted zone 18 acts as a channel guard to stop surface leakage. In the absence of such a guard, the diode exhibits a conductivity inversion at the surface in the presence of moisture, causing high leakage currents and unstable, low breakdown voltages. Thus, the implanted guard zone 18, precisely spaced away from the exposed boundary of P-N junction 17, enables low leakage currents and stable, high breakdown voltages.

What is claimed is:

1. A method for fabricating semiconductor devices of the mesa type comprising providing a slice of semiconductor material of one conductivity type, said slice having plane, parallel major surfaces, converting a portion of said slice adjacent one surface to the opposite conductivity type thereby forming a P-N junction within said slice substantially parallel to the major surfaces of said slice, forming a masking layer of etch resistant material on said one surface in a pattern defining the top surfaces of the mesas to be formed by the etching process, treating said masked surface with an etchant which attacks the exposed semiconductor material substantially isotropically thereby forming an array of moats surrounding the mesas, said moats having a depth below the level of said P-N junction whereby an edge of said P-N junction is exposed on the wall of each mesa and thereby producing an overhanging portion of said masking layer on each mesa as a result of undercutting of the semiconductor material by the etchant, exposing said mesa etched surface to an ion bombardment of a significant impurity of said one conductivity type thereby to alter the conductivity of a zone of the semiconductor material adjacent the bottom of each moat, said zone being spaced away laterally from the exposed edge of said P-N junction by the amount of the overhang of said masking layer, and dividing said slice into individual semiconductor chips along lines defined by the middle of said moats.

* * * * *